United States Patent
Yamagata et al.

(10) Patent No.: US 10,701,848 B2
(45) Date of Patent: Jun. 30, 2020

(54) ELECTROMAGNETIC WAVE ABSORBER AND MOLDED ARTICLE EQUIPPED WITH ELECTROMAGNETIC WAVE ABSORBER

(71) Applicant: NITTO DENKO CORPORATION, Ibaraki-shi, Osaka (JP)

(72) Inventors: Kazuto Yamagata, Ibaraki (JP); Hironobu Machinaga, Ibaraki (JP); Takehiro Ui, Ibaraki (JP); Hiroichi Ukei, Ibaraki (JP); Yuya Kitagawa, Ibaraki (JP); Kazuaki Sasa, Ibaraki (JP)

(73) Assignee: NITTO DENKO CORPORATION, Osaka (JP)

( * ) Notice: Subject to any disclaimer, the term of this patent is extended or adjusted under 35 U.S.C. 154(b) by 222 days.

(21) Appl. No.: 15/774,072

(22) PCT Filed: Dec. 14, 2016

(86) PCT No.: PCT/JP2016/087247
§ 371 (c)(1),
(2) Date: May 7, 2018

(87) PCT Pub. No.: WO2017/104710
PCT Pub. Date: Jun. 22, 2017

(65) Prior Publication Data
US 2018/0332742 A1    Nov. 15, 2018

(30) Foreign Application Priority Data

Dec. 14, 2015 (JP) .................................. 2015-243395
Dec. 13, 2016 (JP) .................................. 2016-241156

(51) Int. Cl.
*H05K 9/00* (2006.01)
*H01Q 17/00* (2006.01)
(Continued)

(52) U.S. Cl.
CPC ............. *H05K 9/0088* (2013.01); *B32B 7/12* (2013.01); *B32B 27/08* (2013.01); *B32B 27/18* (2013.01);
(Continued)

(58) Field of Classification Search
CPC ...... H05K 9/0088; H05K 9/0084; H05K 9/00; H05K 9/0094; H01Q 17/00; H01Q 1/3283;
(Continued)

(56) References Cited

U.S. PATENT DOCUMENTS 5,358,787 A    10/1994  Fontana et al.
5,537,116 A *  7/1996   Ishino ................... H01Q 17/00
                                                              342/1
(Continued)

FOREIGN PATENT DOCUMENTS

CN    1881052 A      12/2006
CN    101599315 A    12/2009
(Continued)

OTHER PUBLICATIONS

Web page https://www.nanopartikel.info/en/nanoinfo/materials/ito/material-information May 2017 (Year: 2017).*
(Continued)

*Primary Examiner* — Frank J McGue
(74) *Attorney, Agent, or Firm* — Westerman, Hattori, Daniels & Adrian, LLP (57) ABSTRACT

For the purpose of providing an electromagnetic wave absorber capable of holding excellent performance over a long period of time, the electromagnetic wave absorber includes: a dielectric layer B including a polymer film and having a first surface and a second surface; a resistive layer A formed on the first surface of the dielectric layer Band containing indium tin oxide as a main component; and an
(Continued)

A: Resistive Layer
B: Dielectric Layer
C: Electrically Conductive Layer electrically conductive layer C formed on the second surface of the dielectric layer B and having a sheet resistance lower than that of the resistive layer A, wherein the indium tin oxide in the resistive layer A contains 20 to 40 wt. % of tin oxide based on the total weight of the indium tin oxide.

15 Claims, 5 Drawing Sheets (51) Int. Cl.
| | |
|---|---|
| *B32B 7/12* | (2006.01) |
| *B32B 27/30* | (2006.01) |
| *B32B 27/08* | (2006.01) |
| *B32B 27/28* | (2006.01) |
| *H01Q 1/32* | (2006.01) |
| *B32B 27/18* | (2006.01) |
| *G01S 13/931* | (2020.01) |
| *B32B 15/08* | (2006.01) |
| *B32B 15/20* | (2006.01) |
| *B32B 33/00* | (2006.01) |

(52) U.S. Cl.
CPC .............. *B32B 27/28* (2013.01); *B32B 27/30* (2013.01); *B32B 27/304* (2013.01); *B32B 27/306* (2013.01); *G01S 13/931* (2013.01); *H01Q 1/3283* (2013.01); *H01Q 17/00* (2013.01); *H05K 9/00* (2013.01); *H05K 9/0094* (2013.01); *B32B 15/08* (2013.01); *B32B 15/20* (2013.01); *B32B 33/00* (2013.01); *B32B 2255/06* (2013.01); *B32B 2255/10* (2013.01); *B32B 2255/205* (2013.01); *B32B 2264/102* (2013.01); *B32B 2264/105* (2013.01); *B32B 2307/202* (2013.01); *B32B 2307/204* (2013.01); *B32B 2307/40* (2013.01); *B32B 2457/00* (2013.01)

(58) Field of Classification Search
CPC ......... B32B 7/12; B32B 27/304; B32B 27/08; B32B 27/306; B32B 27/28; B32B 27/30; B32B 27/18; B32B 2264/105; B32B 2457/00; B32B 2255/205; B32B 2255/06; B32B 2264/102; B32B 2255/10; B32B 15/08; B32B 15/20; B32B 33/00; B32B 2307/202; B32B 2307/204; B32B 2307/40; B32B 7/02; B32B 27/00; B32B 9/045; B32B 2307/206; B32B 2307/212; G01S 13/931
USPC .......................................................... 342/1
See application file for complete search history.

(56) References Cited

U.S. PATENT DOCUMENTS

| | | | |
|---|---|---|---|
| 6,104,534 A | 8/2000 | Ohta et al. | |
| 6,495,752 B1* | 12/2002 | Sugizaki | B32B 27/06 174/389 |
| 2006/0290409 A1 | 12/2006 | Noguchi et al. | |
| 2011/0151215 A1* | 6/2011 | Kobayashi | G06F 3/044 428/212 |
| 2014/0319972 A1* | 10/2014 | Abbott, Jr. | B32B 7/12 310/365 |
| 2015/0355489 A1* | 12/2015 | Takizawa | B32B 7/02 428/212 |

FOREIGN PATENT DOCUMENTS

| | | |
|---|---|---|
| CN | 101600332 A | 12/2009 |
| CN | 101751829 A | 6/2010 |
| CN | 104735964 A | 6/2015 |
| DE | 10 2010 055 850 A1 | 6/2012 |
| EP | 0 677 888 A1 | 10/1995 |
| JP | 7-283577 A | 10/1995 |
| JP | 10-13082 A | 1/1998 |
| JP | 11-73119 A | 3/1999 |
| JP | 2000-243146 A | 9/2000 |
| JP | 2003-198179 A | 7/2003 |
| JP | 2004-319788 A | 11/2004 |
| JP | 2009-71278 A | 4/2009 |

OTHER PUBLICATIONS

International Search Report dated Mar. 14, 2017, issued in counterpart International Application No. PCT/JP2016/087247 (2 pages).
Extended European Search Report dated Dec. 21, 2017, issued in counterpart European Patent Application No. 16875687.2 (6 pages).
English translation of Written Opinion dated Mar. 14, 2017, issued in counterpart International Application No. PCT/JP2016/087247, with Form PCT/IB/310 (6 pages).

* cited by examiner

FIG.1

A: Resistive Layer
B: Dielectric Layer
C: Electrically Conductive Layer

ELECTROMAGNETIC WAVE ABSORBER AND MOLDED ARTICLE EQUIPPED WITH ELECTROMAGNETIC WAVE ABSORBER

TECHNICAL FIELD

The present invention relates to an electromagnetic wave absorber for preventing electromagnetic interference, and a molded article equipped with the electromagnetic wave absorber.

BACKGROUND ART

In recent years, the use of electromagnetic waves in the range of millimeter waves (with a wavelength on the order of 1 to 10 mm and a frequency of 30 to 300 GHz) and submillimeter waves as an information communication medium has been on the increase. In the field of motor vehicle technology, the use of electromagnetic waves has been on the increase, for example, in collision avoidance systems which automatically apply brakes upon sensing obstacles and which measure the speed of a neighboring vehicle and a distance between a user's vehicle and the neighboring vehicle to control the speed of the user's vehicle and the distance between the vehicles. For normal operation of such systems, it is important to receive as little unwanted electromagnetic wave radiation as possible in order to prevent false recognition. It is hence desirable to use electromagnetic wave absorbers that absorb unwanted electromagnetic waves for the purpose of ensuring the performance of these systems.

The aforementioned electromagnetic wave absorbers are of various types according to the principles of the absorption of the electromagnetic waves. For example, it is known that an electromagnetic wave absorber of the type (referred to hereinafter as a "$\lambda/4$ type") including an electromagnetic wave reflection layer, a dielectric layer having a thickness of $\lambda/4$ (where $\lambda$ is an intended wavelength of an electromagnetic wave) and a resistive thin film layer is produced at low costs because of its relatively inexpensive materials and its easier designs. An electromagnetic wave absorber having an excellent property of functioning over a wide range of incident angles has been proposed in PTL 1, for example, as such a $\lambda/4$ type electromagnetic wave absorber.

RELATED ART DOCUMENT

Patent Document

PTL 1-JP-A-2003-198179

SUMMARY OF INVENTION

The electromagnetic wave absorber disclosed in PTL 1 has the excellent property over a wide range of incident angles. It has been strongly desired to hold this excellent performance of the electromagnetic wave absorber over a longer period of time because the technological development of fully autonomous driving has been promoted to involve the need for further increase in reliability of the collision avoidance systems.

In view of the foregoing, it is therefore an object to provide a $\lambda/4$ type electromagnetic wave absorber and a molded article equipped with the electromagnetic wave absorber which are capable of holding the performance thereof over a long period of time.

To accomplish the aforementioned object, a first aspect of the present invention is intended for an electromagnetic wave absorber comprising: a dielectric layer including a polymer film and having a first surface and a second surface; a resistive layer formed on the first surface of the dielectric layer and containing indium tin oxide (referred to hereinafter as "ITO") as a main component; and an electrically conductive layer formed on the second surface of the dielectric layer and having a sheet resistance lower than that of the resistive layer, wherein the ITO in the resistive layer contains 20 to 40 wt. % of tin oxide (referred to hereinafter as "$SnO_2$") based on the total weight of the ITO.

In particular, a second aspect of the present invention is intended for the electromagnetic wave absorber of the first aspect, wherein the resistive layer contains a component other than the ITO. A third aspect of the present invention is intended for the electromagnetic wave absorber of the second aspect, wherein the component other than the ITO in the resistive layer is at least one selected from the group consisting of silicon oxide, magnesium oxide and zinc oxide. A fourth aspect of the present invention is intended for the electromagnetic wave absorber of the first to third aspects, wherein the electrically conductive layer is made of ITO. A fifth aspect of the present invention is intended for the electromagnetic wave absorber of the fourth aspect, wherein the ITO in the electrically conductive layer contains 5 to 15 wt. % of $SnO_2$ based on the total weight of the ITO. A sixth aspect of the present invention is intended for the electromagnetic wave absorber of the first to third aspects, wherein the electrically conductive layer is made of at least one selected from the group consisting of aluminum (referred to hereinafter, as "Al"), copper (referred to hereinafter as "Cu") and their alloys. A seventh aspect of the present invention is intended for the electromagnetic wave absorber, of the first to sixth aspects, wherein the resistive layer has a sheet resistance in the range of 300 to 500 $\Omega/\square$. An eighth aspect of the present invention is intended for the electromagnetic wave absorber of the first to seventh aspects, wherein the resistive layer has a thickness in the range of 20 to 100 nm. A ninth aspect of the present invention is intended for the electromagnetic wave absorber of the first to eighth aspects, wherein the dielectric layer includes a polymer film having a relative dielectric constant of 2.0 to 20.0. A tenth aspect of the present invention is intended for the electromagnetic wave absorber of the first to ninth aspects, wherein the polymer film of the dielectric layer is made of at least one selected from the group consisting of ethylene-vinyl acetate copolymer, vinyl chloride, urethane, acrylic, acrylic urethane, polyethylene, silicone and polyethylene terephthalate.

An eleventh aspect of the present invention is intended for the electromagnetic wave absorber of the first to tenth aspects, wherein a coating layer is provided in at least one of a location between the dielectric layer and the resistive layer and a location between the dielectric layer and the electrically conductive layer. A twelfth aspect of the present invention is intended for the electromagnetic wave absorber, of the eleventh aspect, wherein the coating layer is made of at least one selected from the group-consisting of silicon oxide ($SiO_2$, SiO), silicon nitride (SiN), aluminum oxide ($Al_2O_3$), aluminum nitride (AlN), niobium oxide ($Nb_2O_5$), silicon tin oxide (STO) and aluminum-doped zinc oxide (AZO). A thirteenth aspect of the present invention is intended for the electromagnetic wave absorber of the eleventh and twelfth aspects, wherein the coating layer has a thickness in the range of 5 to 100 nm. A fourteenth aspect of the present invention is intended for the electromagnetic wave absorber of the first to thirteenth aspects which further comprises an adhesive layer provided outside the electrically conductive layer. A fifteenth aspect of the present invention is intended for a molded article equipped with an electromagnetic wave absorber as recited in the first to fourteenth aspects.

The present inventors have directed attention toward the problem of the need for further improvement in the reliability of the collision avoidance system, and have diligently made studies not only for the reduction in costs of the electromagnetic wave absorber but also for the holding of the excellent performance thereof over a long period of time. As a result, the present inventors have found that the aforementioned problem is solved by providing a λ/4 type electromagnetic wave absorber in the form of a laminate including: a dielectric layer including a polymer film and having a first surface and a second surface; a resistive layer formed on the first surface of the dielectric layer and containing ITO as a main component; and an electrically conductive layer formed on the second surface of the dielectric layer and having a sheet resistance lower than that of the resistive layer, wherein the ITO in the resistive layer contains 20 to 40 wt. % of $SnO_2$. Thus, the present inventors have attained the present invention.

The $SnO_2$ content of the resistive layer according to the present invention may be measured using X-ray photoelectron spectroscopy (XPS) or an electron probe microanalyzer (EPMA).

The sheet resistances of the resistive layer and the electrically conductive layer according to the present invention may be measured, for example, using resistance measurement methods of contact type (four-point probe method) or non-contact type (eddy current method).

The term "main component" as used in the present invention, means a component that influences the properties of the material. The "main component" refers to a component that generally makes up at least 50 wt. % of the whole material, and is to be interpreted as including meaning that the whole consists only of the main component.

The electromagnetic wave absorber according to the present invention is a λ/4 type electromagnetic wave absorber including: a dielectric layer including a polymer film and having a first surface and a second surface; a resistive layer formed on the first surface of the dielectric layer and containing ITO as a main component; and an electrically conductive layer formed on the second surface of the dielectric layer and having a sheet resistance lower than that of the resistive layer. This electromagnetic wave absorber is easily designed in accordance with an intended frequency, and is manufactured at low costs because relatively inexpensive materials may be used. Also, the ITO in the resistive layer contains 20 to 40 wt. % of $SnO_2$ based on the total weight of the ITO. This provides an extremely stable amorphous structure, and allows variations in sheet resistance of the resistive layer to fall below approximately 15% if a change with time or an environmental change is effected, thereby producing the electromagnetic wave absorption effect over a long period of time.

In particular, in the case where the resistive layer contains a component other than the ITO in addition to the ITO that is a main component thereof, the durability of the resistive layer is increased, and the sheet resistance value of the resistive layer is held with accuracy over a longer period of time. The use of silicon oxide, magnesium oxide and zinc oxide as the component other than the ITO is preferable because the aforementioned effect is further improved.

In the case where the electrically conductive layer is made of ITO, a transparent electromagnetic wave absorber is provided, which not only becomes applicable to locations where transparency is required, but also allows a user to view a mounting location therethrough, thereby achieving improvements in positioning accuracy and in workability.

Further, in the case where the ITO in the electrically conductive layer contains 5 to 15 wt. % of $SnO_2$ based on the total weight of the ITO, the ITO is easily formed into a stable polycrystalline structure by an annealing process. The electrically conductive layer has a low sheet resistance value that is not greater than one-fifth the sheet resistance value of the resistive layer, and the performance of the electromagnetic wave absorber is held over a longer period of time.

In the case where the electrically conductive layer is made of at least one selected from the group-consisting of aluminum, copper and their alloys, the sheet resistance value is easily decreased. This achieves reflection close to total reflection to improve the absorption performance of the electromagnetic wave absorber.

In the case where the resistive layer has a sheet resistance in the range of 300 to 500 Ω/☐, electromagnetic waves are attenuated effectively.

In the case where the resistive layer has a thickness in the range of 20 to 100 nm, the resistive layer having a desired sheet resistance is formed with high thickness accuracy. This provides the electromagnetic wave absorber having a more uniform electromagnetic wave absorption effect.

In the case where the dielectric layer includes a polymer film having a relative dielectric constant of 2.0 to 20.0, the thickness of the dielectric layer is easy to control. This provides the electromagnetic wave absorber having a more uniform electromagnetic wave absorption effect.

In the case where the polymer film of the dielectric layer is made of at least, one selected from the group consisting of ethylene-vinyl acetate copolymer, vinyl chloride, urethane, acrylic, acrylic urethane, polyethylene, silicone and polyethylene terephthalate, the electromagnetic wave absorber having good balance between dimensional stability and costs and having good usability is provided.

In the case where a coating layer is provided in at least one of a location between the dielectric layer and the resistive layer and a location between the dielectric layer and the electrically conductive layer, a component in the dielectric layer is prevented from diffusing into the resistive layer or the electrically conductive layer. This prevents the sheet resistance of the resistive layer or the electrically conductive layer from being influenced by the component in the dielectric layer to achieve a stable sheet resistance value held over a long period of time.

In particular, in the case where the coating layer is made of at least one selected from the group consisting of $SiO_2$, SiN, $Al_2O_3$, AlN, $Nb_2O_5$, STO and AZO, a component in the dielectric layer is prevented from diffusing into the resistive layer or the electrically conductive layer with higher reliability. This achieves high absorption performance held over a long period of time.

In the case where the coating layer has a thickness in the range of 5 to 100 nm, the stability of the sheet resistance of the resistive layer or the electrically conductive layer and the durability of the resistive layer or the electrically conductive layer are especially excellent.

The electromagnetic wave absorber further comprising an adhesive layer provided outside the electrically conductive layer is easily attached to another member (to-be-attached member). In addition, the position of attachment of the electromagnetic wave absorber is fixed. This achieves the stable maintenance of excellent electromagnetic wave absorption performance.

Also, a molded article equipped with any one of these electromagnetic wave absorbers is capable of exhibiting excellent electromagnetic wave absorption performance with higher stability because the electromagnetic wave absorber is always disposed in position precisely.

DESCRIPTION OF EMBODIMENTS

Next, embodiments according to the present disclosure will now be described in detail with reference to the drawings. It should be noted that the present disclosure is not limited to the embodiments.

Figure 1:
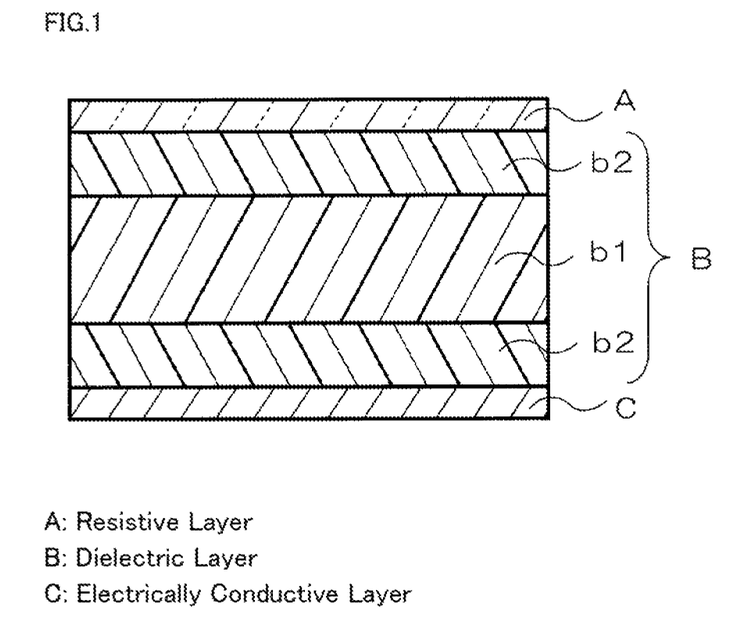
FIG. 1 is a sectional view of an electromagnetic wave absorber accordin_ to a first embodiment of the present invention.

An electromagnetic wave absorber according to the present disclosure includes a laminate having a resistive layer A, a dielectric layer B and an electrically conductive layer C which are arranged in the order named, for example, as shown in FIG. 1. The dielectric layer B includes a laminated film having a resin layer b2, a resin layer b1 and a resin layer b2 which are laminated together in the order named. The components are schematically shown in FIG. 1. The thickness, size and the like of the components shown in FIG. 1 are different from the actual ones (the same holds true for the following figures).

This electromagnetic wave absorber is a λ/4 type electromagnetic wave absorber configured such that, when an electromagnetic wave ($\lambda_o$) having a wavelength (cycle) intended to be absorbed enters the λ/4 type electromagnetic wave absorber, an electromagnetic wave obtained by the reflection (front surface reflection) from a surface of the resistive layer A and an electromagnetic wave obtained by the reflection (back surface reflection) from a surface of the electrically conductive layer C interfere with each other. In the λ/4 type electromagnetic wave absorber, it is known that the thickness (t) and relative dielectric constant ($\varepsilon_r$) of the dielectric layer B determine the wavelength (cycle) of the electromagnetic wave ($\lambda_o$) intended to be absorbed, as represented by Equation (1) below. That is, the electromagnetic wave having the wavelength (cycle) intended to be absorbed is set by appropriately setting the material and thickness of the dielectric layer B. The components of the electromagnetic wave absorber will be described in order hereinafter.

[MATH. 1]

$$\lambda_o = 4\,t\sqrt{\varepsilon_r} \quad (1)$$

<Resistive Layer A>

The resistive layer A is disposed in order to reflect the electromagnetic wave having the intended wavelength (cycle) near the front surface of the electromagnetic wave absorber. The resistive layer A contains ITO as a main component. The concentration expressed in percentage by weight of $SnO_2$ in the ITO is in the range of 20 to 40 wt. %. More preferably, the ITO contains 25 to 35 wt. % of SnOs. The resistive layer A, in which the amount of $SnO_2$ in the ITO is in the aforementioned range, has an extremely stable amorphous structure to suppress variations in sheet resistance of the resistive layer A under high-temperature and high-humidity environments. It should be noted that widely used ITO generally contains 5 to 15 wt. % of $SnO_2$, and is different from the ITO for use in the resistive layer A according to the present disclosure. The ITO containing 5 to 15 wt. % of $SnO_2$ can easily provide a resistive layer having a sheet resistance of 300 to 500 Ω/□ when formed as an amorphous film without performing an annealing process. This resistive layer, however, is crystallized by an environmental change such as heating or humidified heat to significantly vary in resistance value. For this reason, this resistive layer cannot be used as a resistive layer for a radio wave absorber. When the ITO containing 5 to 15 wt. % of $SnO_2$ is formed into a polycrystalline structure by an annealing process, the polycrystalline structure has long-term stability but has too high electrical conductivity. For the provision of the resistive layer A having a sheet resistance of 300 to 500 Ω/□ by forming the widely used ITO into a polycrystalline structure, it is hence necessary that the resistive layer A is an extremely thin film, having a thickness of not greater than 10 nm. It is very difficult for an extremely thin film having a thickness of not greater than 10 nm to have a uniform thickness as designed. The control of the resistance value of such an extremely thin film is accordingly very difficult.

The resistive layer A may further contain a component other than ITO. Examples of such a component include silicon oxide, magnesium oxide and sine oxide. Such a component other than ITO is preferably in trace amounts when contained in the resistive layer A. For example, the component other than ITO is preferably contained in an amount of 0.5 to 10 parts by weight, and more preferably in an amount of 1 to 5 parts by weight, per 100 parts by weight of ITO. When the resistive layer A contains such a component other than ITO, the thickness of the resistive layer A can be increased without any change in sheet resistance value. This increases the durability of the resistive layer A to thereby allow the sheet resistance value of the resistive layer A to be held with accuracy over a longer period of time.

The sheet resistance of the resistive layer A is preferably in the range of 300 to 500 Ω/□, and more preferably in the range of 350 to 450 Ω/□. When the sheet resistance of the resistive layer A is in the aforementioned range, the electromagnetic waves are attenuated effectively.

The thickness of the resistive layer A is preferably in the range of 20 to 100 nm, and more preferably in the range of 25 to 60 nm. If the resistive layer A is too thick or too thin, the reliability of the sheet resistance value tends to decrease when a change with time or an environmental change is effected.

<Dielectric Layer B>

The dielectric layer B includes the laminated film having the resin layer b2, the resin layer b1 and the resin layer b2 which are laminated together in the order named (with reference to FIG. 1). The resin layers b2 need not necessarily be provided. That is, the dielectric layer B may include a single-layer film. It is, however, preferable to provide the resin layers b2 on opposite sides of the resin layer b1 from the viewpoints of the ease of formation of the resin layer b1 of a constant thickness and the ease of formation of the resistive layer A and the electrically conductive layer C. The relative dielectric constant ($\varepsilon_r$) of the dielectric layer B comprised of a plurality of layers is calculated by measuring the relative dielectric constants of the respective layers, multiplying each of the relative dielectric constants by the ratio of the thickness of each of the plurality of layers to the total thickness of the dielectric layer, and then adding the products obtained toy the multiplications together.

[Resin Layer b1]

The resin layer b1 serves an important function in determining the wavelength (cycle) of the electromagnetic wave ($\lambda_o$) intended to be absorbed, and is obtained by forming a resin composition having a predetermined relative dielectric constant ($\varepsilon_r$) so that the resin composition will have a predetermined thickness (t) after being cured in accordance with the wavelength (cycle) of the electromagnetic wave ($\lambda_o$) intended to be absorbed, and then curing the resin composition. Preferable examples of the resin composition used for the resin layer b1 include: synthetic resins such as ethylene-vinyl acetate copolymer (EVA), vinyl chloride, urethane, acrylic, acrylic urethane, polyethylene, silicone, polyethylene terephthalate, polyester, polystyrene, polyimide, polycarbonate, polyamide, polysulfone, polyether sulfone and epoxy; and synthetic rubbers such as polyisoprene rubber, polystyrene-butadiene rubber, polybutadiene rubber, chloroprene rubber, acrylonitrile-butadiene rubber, butyl rubber, acrylic rubber, ethylene propylene rubber and silicone rubber which are used as resin components. In particular, EVA is preferably used from the viewpoints of moldability and relative dielectric, constant. The use of urethane, acrylic and acrylic urethane achieves a further reduction in the thickness of the resin layer b1 to thereby achieve the thinning of the entire electromagnetic wave absorber. These resin compositions may be used either alone or in combination.

The thickness of the resin layer b1 is preferably in the range of 50 to 2000 μm, and more preferably in the range of 100 to 1000 μm. If the resin layer b1 is too thin, it is difficult to ensure the dimensional accuracy of the thickness thereof. If the resin layer b1 is too thick, material costs are increased.

[Resin Layers b2]

The resin layers b2 are substrates for the formation of the resistive layer A or the electrically conductive layer C by sputtering or the like, and are used as an ancillary material for precisely controlling the thickness of the resin layer b1 during the formation of the resin layer b1. The resin layers b2 are preferably made of a material resistant to high temperatures of evaporation, sputtering and the like for use in the formation of the resistive layer A or the electrically conductive layer C. Examples of the material of the resin layers b2 include polyethylene terephthalate (PET), polyethylene naphthalate (PEN), acrylic (PMMA) polycarbonate (PC) and cycloolefin polymer (COP). In particular, PET is preferably used, because of its excellent heat resistance and its good balance between dimensional stability and costs. The resin layers b2 on opposite sides of the resin layer b1 may be made of the same material or different materials.

The thickness of the resin layers b2 is preferably in the range of 10 to 125 μm, and more preferably in the range of 20 to 50 μm. If the resin layers b2 are too thin, wrinkles or deformation is prone to occur in the resin layers b2 during the formation of the resistive layer A. If the resin layers b2 are too thick, the bendability of the electromagnetic wave absorber is decreased. The resin layers b2 on opposite sides of the resin layer b1 may have the same thickness or different thicknesses.

<Electrically Conductive Layer C>

The electrically conductive layer C is disposed in order to reflect the electromagnetic wave having the intended wavelength (cycle) near the back surface of the electromagnetic wave absorber. The electrically conductive layer C has a sheet resistance sufficiently lower than that of the resistive layer A. Based on these facts, examples of the material of the electrically conductive layer C include ITO, Al, Cu, nickel (Ni), chromium (Cr), molybdenum (Mo) and alloys of these metals. In particular, ITO is preferably used from the viewpoints of not only providing a transparent electromagnetic wave absorber to become applicable to locations where transparency is required but also achieving improvements in workability. In particular, ITO containing 5 to 15 wt. % of $SnO_2$ based on the total weight of the ITO is preferably used. On the other hand, Al, Cu or alloys of these metals are preferably used from the viewpoints of easily lowering the sheet resistance value and further reducing noise. The thickness of the electrically conductive layer C is preferably in the range of 20 to 200 nm, and more preferably in the range of 50 to 150 nm. If the electrically conductive layer C is too thick, the electrically conductive layer C is prone to suffer stresses and cracks. If the electrically conductive layer C is too thin, a desired low resistance value cannot be obtained. The sheet resistance of the electrically conductive layer C is preferably 1/500 to 1/5, and further preferably 1/200 to 1/15, of the sheet resistance of the resistive layer A.

With this configuration, the resistive layer A contains, as a main component, ITO containing 20 to 40 wt. % of $SnO_2$ based on the total weight, of the ITO. If a change with time or an environmental change is effected in the electromagnetic wave absorber, this configuration allows variations in the sheet resistance of the resistive layer A to fall below approximately 15%, thereby achieving the absorption of the electromagnetic wave having the target wavelength (cycle) over a long period of time.

The electromagnetic wave absorber according to the first embodiment includes the laminate comprised of the resistive layer A, the dielectric layer B and the electrically conductive layer C. However, an additional layer other than these layers A, B and C may be provided in the electromagnetic wave absorber. Specifically, additional layers may be provided outside the resistive layer A, outside the electrically conductive layer C, between the resistive layer A and the dielectric layer B, and between the dielectric layer B and the electrically conductive layer C.

Figure 2:
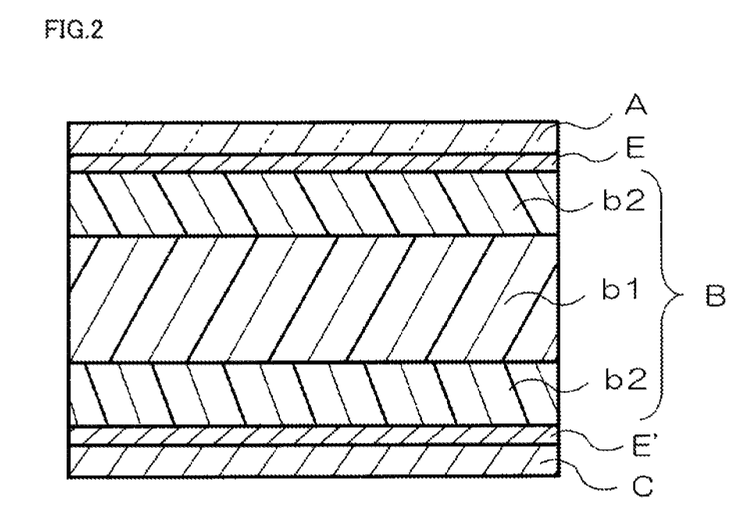
FIG. 2 is a view illustrating the electromagnetic wave absorber provided with coating layers.

For example, the provision of a coating layer outside the resistive layer A increases the durability and weather resistance of the resistive layer A. As shown in FIG. 2, the provision of a coating layer E between the resistive layer A and the dielectric layer B or the provision of a coating layer E' between the dielectric layer B and the electrically conductive layer C prevents a component in the dielectric layer B from diffusing into the resistive layer A or the electrically conductive layer C. This prevents, the sheet resistances of the resistive layer A and the electrically conductive layer C from being influenced by the component in the dielectric layer B to achieve high absorption performance held over a long period of time. The coating layer E between the resistive layer A and the dielectric layer B and the coating layer E' between the dielectric layer B and the electrically conductive layer C may be made of the same material or different materials. For this effect, both of the coating layer E between the resistive layer A and the dielectric layer B and the coating layer E' between the dielectric layer B and the electrically conductive layer C need not be provided, but either one of the coating layers E and E' may be provided. In particular, the coating layer E is preferably provided between the resistive layer A and the dielectric layer B. Of course, additional layers may be provided between the resistive layer A and the coating layer E and between the electrically conductive layer C and the coating layer E'.

Examples of the material of the coating layers E and E' include $SiO_2$, SiN, $Al_2O_3$, AlN, $Nb_2O_5$, STO and AZO. In particular, AlN and AZO, which further increase the durability of the resistive layer A or the electrically conductive layer C, are preferably used.

The thickness of the coating layers E and E' is preferably in the range of 5 to 100 nm, and more preferably in the range of 10 to 50 nm. If the coating layers E and E' are too thin, there is apprehension that the effect of increasing the durability of the resistive layer A or the electrically conductive layer C becomes poor. If the coating layers E and E' are too thick, the coating layers E and E' are prone to become cracked, so that there is tendency to fail to produce the stable effect of increasing the durability.

Figure 3:
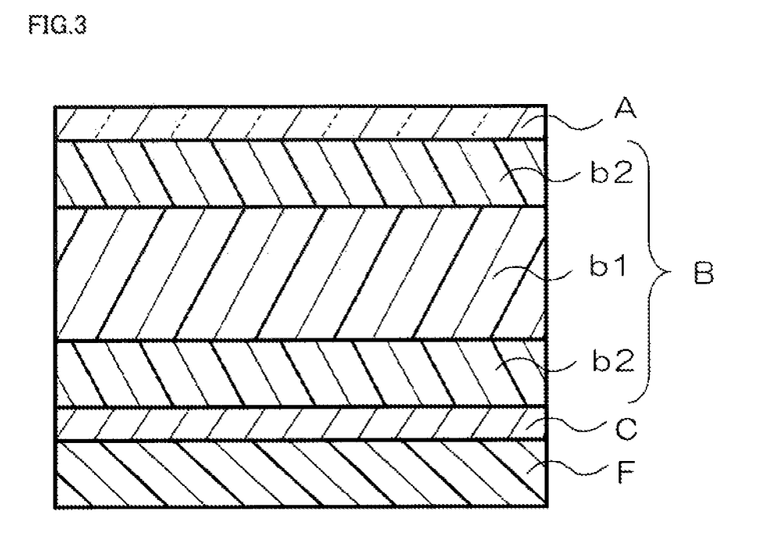
FIG. 3 is a view illustrating the electromagnetic wave absorber provided with an adhesive layer.

As shown in FIG. 3, an adhesive layer F may be provided outside the electrically conductive layer C (on the opposite side from the dielectric layer) as the aforementioned additional layer. The provision of the adhesive layer F not only facilitates the attachment to another member (to-be-attached member) but also fixes the position of attachment of the electromagnetic wave absorber to thereby achieve the stable maintenance of excellent electromagnetic wave absorption performance. Of course, an additional layer may be provided between the electrically conductive layer C and the adhesive layer F.

Examples of the material of the adhesive layer E used herein include pressure sensitive adhesives such as rubber pressure sensitive adhesives, acrylic pressure sensitive adhesives, silicone pressure sensitive adhesives and urethane pressure sensitive adhesives. Also, adhesive agents such as emulsion adhesive agents, rubber adhesive agents, epoxy adhesive agents, cyanoacrylate adhesive agents, vinyl adhesive agents and silicone adhesive agents may foe used as the material of the adhesive layer F. These examples of the material of the adhesive layer F may be selected as appropriate depending on the material and shape of the to-be-attached member. In particular, acrylic pressure sensitive adhesives are preferably used from the viewpoints of their long-term adhesive strength and their high reliability of attachment.

The electromagnetic wave absorber (with reference to FIG. 1) according to the first embodiment of the present disclosure is manufactured, for example, in a manner to be described below.

Figure 4:
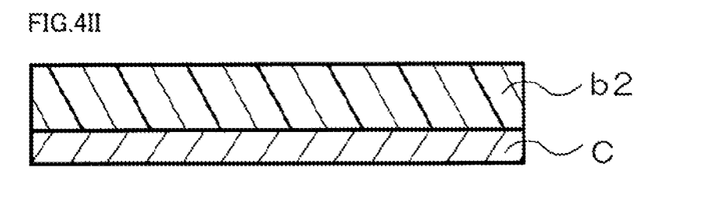
Figure 4I:
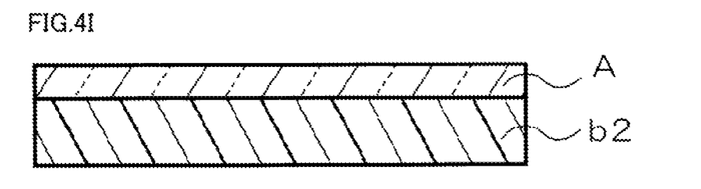
FIGS. 4I and 4II are views illustrating a method of producing the electromagnetic wave absorber.

First, as shown in FIG. 4I, the resistive layer A is formed on one of the resin layers b2 shaped in film form. Also, as shown in FIG. 4II, the electrically conductive layer C is formed on (in FIG. 4II, beneath) the other resin layer b2 shaped in film form. The resistive layer A and the electrically conductive layer C may be formed by sputtering, evaporation, or the like. In particular, sputtering is preferably used from the viewpoint of its ability to control the resistance value and the thickness precisely.

Figure 5:
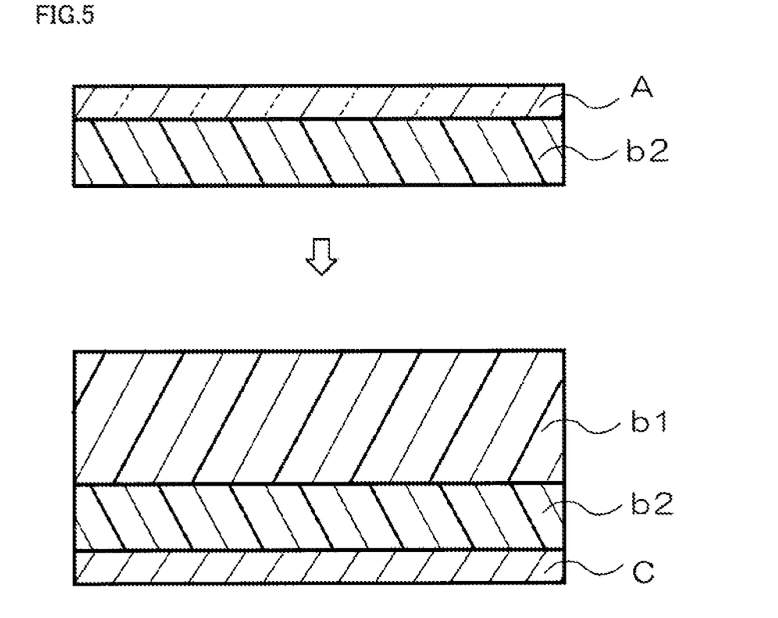
FIG. 5 is a view illustrating the method of producing the electromagnetic wave absorber.

Next, as shown in FIG. 5, a resin composition for forming the resin layer b1 is applied to, printed on or extruded onto the opposite surface of the other resin layer b2 with the electrically conductive layer C formed thereon from the electrically conductive layer C. Then, the opposite surface of the one resin layer b2 with the resistive layer A formed thereon from the resistive layer A is overlaid on the resin composition. The thickness of the resin composition is adjusted. Thereafter, the resin composition is cured to form the resin layer b1. This provides the electromagnetic wave absorber shown in FIG. 1 and including the resistive layer A, the dielectric layer B (a composite film comprised of the one resin layer b2, the resin layer b1 and the other resin layer b2) and the electrically conductive layer C which are laminated together in the order named.

This provides the electromagnetic wave absorber capable of effectively absorbing the electromagnetic wave having the intended wavelength (cycle) because of the ease of control of the thickness of the resin layer b1. Also, the resistive layer A and the electrically conductive layer C may be formed Separately. This shortens the time regal red for the manufacture of the electromagnetic wave absorber to achieve the manufacture of the electromagnetic wave absorber at low costs.

The process for forming the dielectric layer B comprised of only the resin layer b1 may be performed, for example, by initially preparing the resin layer b1 in film form having a predetermined thickness, forming the resistive layer A on a first surface of the resin layer b1 in film form, and then forming the electrically conductive layer C on a second surface thereof.

The process for providing the coating layer E between the resistive layer A and the dielectric layer B as shown in FIG. 2 may be performed, for example, by previously forming the coating layer E by application or the like on the one resin layer b2 in the step shown in FIG. 4I, and then forming the resistive layer A on the coating layer E. Similarly, the process for providing the coating layer E' between the dielectric layer B and the electrically conductive layer C may be performed, for example, by previously forming the coating layer E' by application or the like on the other resin layer b2 in the step shown in FIG. 4II, and then forming the electrically conductive layer C on the coating layer E'.

The process for providing the adhesive layer F as shown in FIG. 3 may be performed, for example, by producing the electromagnetic wave absorber shown in FIG. 1, and thereafter forming the aforementioned pressure sensitive adhesive or adhesive agent by application or the like on the outside of the electrically conductive layer C (on the opposite side from the dielectric layer).

Figure 6:
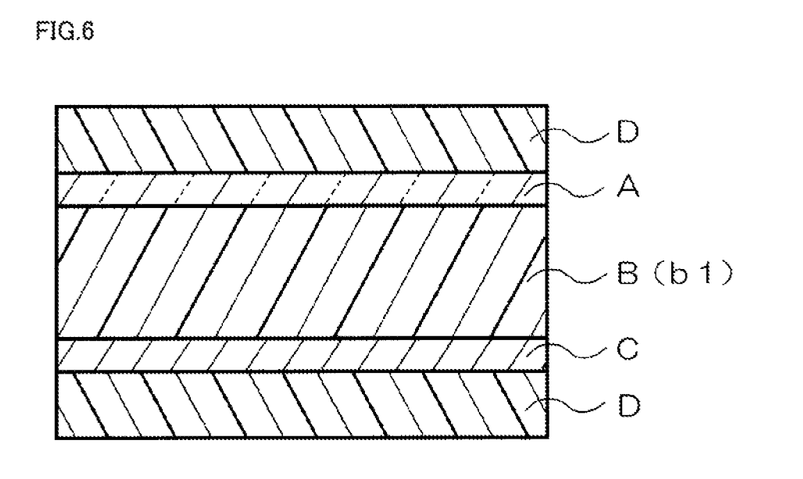
FIG. 6 is a sectional view of an electromagnetic wave absorber according to a second embodiment of the present invention.

Next, a second embodiment of the present disclosure will be described. FIG. 6 shows an electromagnetic wave absorber according to the second embodiment of the present disclosure. In the second embodiment, the dielectric layer B is comprised of the single layer, i.e. the resin layer b1, and the resistive layer A is formed directly on a first surface of the dielectric layer B whereas the electrically conductive layer C is formed directly on a second surface thereof. In FIG. 6, the reference character D designates resin layers serving as substrates for the formation of the resistive layer A and the electrically conductive layer C by sputtering or the like. Other parts of the second embodiment are similar to those of the aforementioned first embodiment, and the second embodiment produces an effect similar to that of the aforementioned first embodiment. In addition to this effect, the second embodiment has increased durability because the resin layers D function as respective coating layers for the resistive layer A and the electrically conductive layer C to protect these layers A and C from the outside environment. The resin layers D are preferably made of a material resistant to high temperatures of evaporation, sputtering and the like for use in the formation of the resistive layer A or the electrically conductive layer C. Examples of the material of the resin layers D include polyethylene terephthalate (PET), polyethylene naphthalate (PEN), acrylic (PMMA), polycarbonate (PC) and cycloolefin polymer (COP). In particular, PET is preferably used because of its excellent heat resistance and its good balance between dimensional stability and costs. The resin layers D on opposite sides, i.e. the resistive layer A side and the electrically conductive layer C side, may be made of the same material or different materials.

Figure 7:
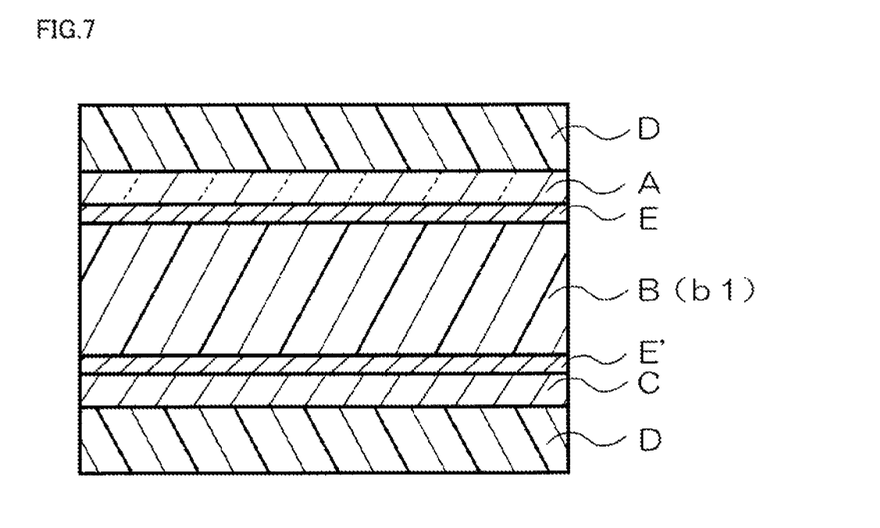
FIG. 7 is a view illustrating the electromagnetic wave absorber provided with the coating layers.
Figure 8:
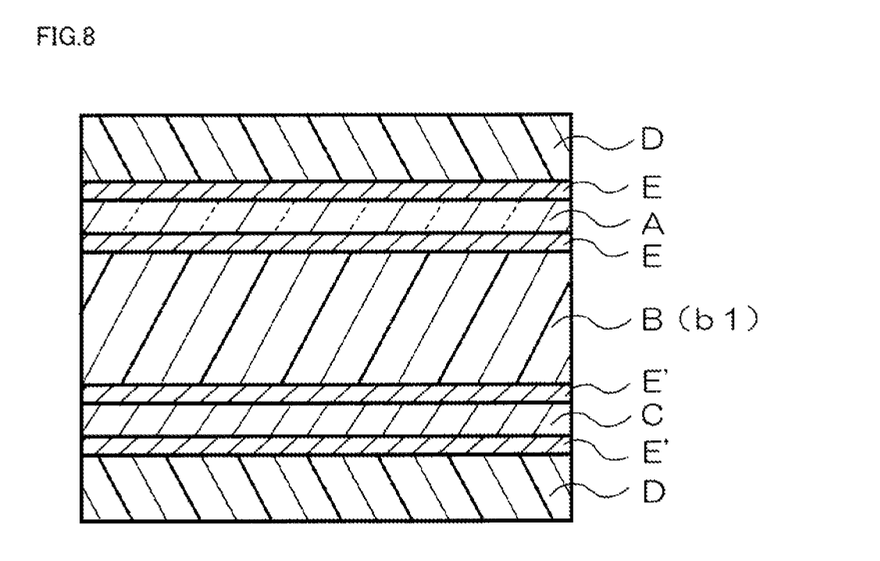
FIG. 8 is a view illustrating another example of the electromagnetic wave absorber provided with the coating layers.

As in the aforementioned first embodiment, additional layers may also be provided between the layers in the electromagnetic wave absorber of the second embodiment shown in FIG. 6. Specifically, the same additional layers as illustrated in the aforementioned first embodiment may be used to produce similar effects. For example, the additional layers may be provided outside the resin layers D, between the resistive layer A and the dielectric layer B (resin layer b1), and between the dielectric layer B (resin layer b1) and the electrically conductive layer C. The coating layers E and E' and the adhesive layer F are included in the additional layers, but other layers may be used. FIG. 7 shows an instance in which the coating layer E is provided between the resistive layer A and the dielectric layer B (resin layer b1) and the coating layer ET is provided between the dielectric layer B (resin layer b1) and the electrically conductive layer C. In this instance, a component in the dielectric layer B is effectively prevented from diffusing into the resistive layer A and the electrically conductive layer C. FIG. 8 shows an instance in which the coating layer E is further provided between the resistive layer A and one of the resin layers D and the coating layer E' is further provided between the electrically conductive layer C and the other resin layer D. In this instance, the resistive layer A and the electrically conductive layer C are protected with reliability, so that variations in the sheet resistances thereof are prevented over a long period of time. This further increases the reliability.

The electromagnetic wave absorber according to the second embodiment shown in FIG. 6 is manufactured, fox example, in a manner to be described below.

Figure 9:
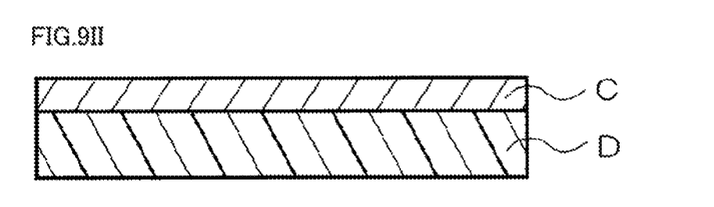
Figure 9I:
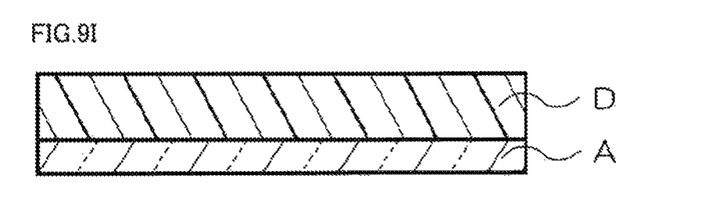
FIGS. 9I and 9II are views illustrating a method of producing the electromagnetic wave absorber according to the second embodiment shown, in FIG. 6.

First, as shown in FIG. 9I, the resistive layer A is formed on (in FIG. 9I, beneath) the one resin layer D shaped in film form. Also, as shown, in FIG. 9II, the electrically conductive layer C is formed on the other resin layer D shaped in film form. The resistive layer A and the electrically conductive layer C may be formed by sputtering, evaporation or the like. In particular, sputtering is preferably used from the viewpoint of its ability to control the resistance value and the thickness precisely.

Figure 10:
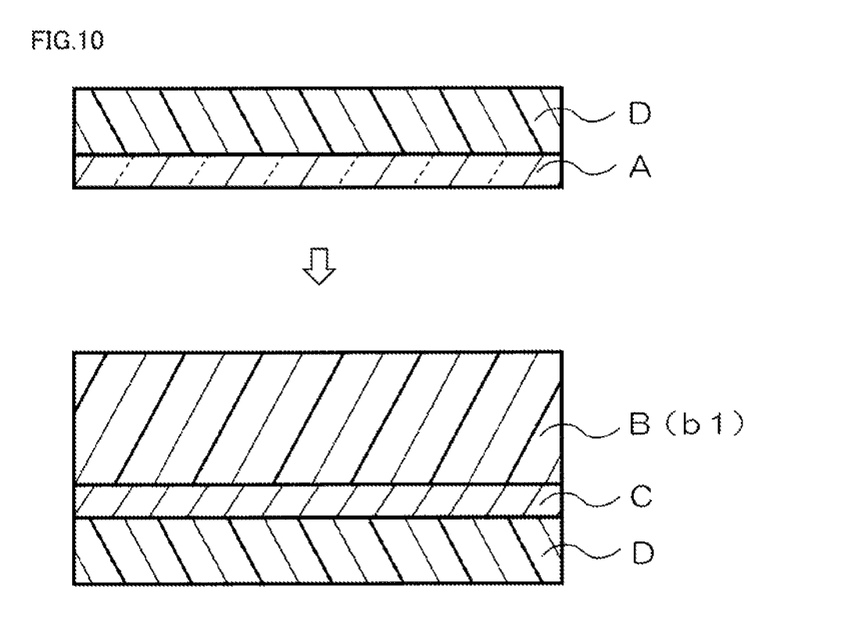
FIG. 10 is a view illustrating the method of producing the electromagnetic wave absorber according to the second embodiment shown in FIG. 6.

Next, as shown in FIG. 10, a resin composition for forming the resin layer b1 is applied to, printed on or extruded onto the opposite surface of the other resin layer D with the electrically conductive layer C formed thereon from the electrically conductive layer C. Then, the opposite surface of the resistive layer A from the one resin layer D is overlaid on the resin composition. The thickness of the resin composition is adjusted. Thereafter, the resin composition is cured to form the dielectric layer B (resin layer b1). This provides the electromagnetic wave absorber shown in FIG. 6 and including the one resin layer D, the resistive layer A, the dielectric layer B (resin layer b1), the electrically conductive layer C and the other resin layer D which are laminated together in the order named. Although the dielectric layer B is comprised of the single layer, i.e. the resin layer b1, this method achieves the precise setting of the wavelength (cycle) of the electromagnetic wave intended to be absorbed because it is easy to form the dielectric layer B (resin layer b1) with a constant thickness. Also, this method is capable of precisely controlling the resistance values of the resistive layer A and the electrically conductive layer C. This achieves the manufacture of the electromagnetic wave absorber capable of maintaining excellent electromagnetic wave absorption performance over a long period of time.

The process for providing the coating layer E between the resistive layer A and the dielectric layer B as shown in FIG. 7 may be performed, for example, by forming the coating layer E by sputtering, chemical vapor deposition (CVD), application or the like on the resistive layer A in the step shown in FIG. 9I. Similarly, the process for providing the coating layer E' between the dielectric layer B and the electrically conductive layer C may be performed, for example, by forming the coating layer E' by sputtering, chemical vapor deposition (CVD), application or the like on the electrically conductive layer C in the step shown in FIG. 9II.

The process for further providing the coating layer E between the one resin layer D and the resistive layer A as shown in FIG. 8 may be performed, for example, by previously forming the coating layer E by sputtering, chemical vapor deposition (CVD), application or the like on the one resin layer D in the step shown in FIG. 9I, and then forming the resistive layer A on the coating layer E. Similarly, the process for further providing the coating layer E' between the electrically conductive layer C and the other resin layer D may be performed, for example, by previously forming the coating layer E' by sputtering, chemical vapor deposition (CVD), application or the like on the other resin layer D in the step shown in FIG. 9II, and then forming the electrically conductive layer C on the coating layer E'.

EXAMPLES

The present disclosure will be described hereinafter in further detail using inventive examples and comparative examples. The present disclosure is not limited to the inventive examples to be described below within the scope of the present disclosure.

Test Examples 1 to 10

Prior to description on Inventive Examples and Comparative Examples of the present disclosure, the reliability of the resistive layer A in the electromagnetic wave absorber according to the present disclosure, was evaluated in accordance with indices described below in [Reliability Evaluation 1] and [Reliability Evaluation 2]. These evaluations were performed using n=5 for each test, example, and the average was defined as an evaluation for each test example. The evaluations (Reliability Evaluation 1 and Reliability Evaluation 2) in each test, example are listed in TABLE 1 below.

[Reliability Evaluation 1]

In Test Examples 1 to 6 out of Test Examples 1 to 10, a resistive layer was formed on a base material in film form (PET available from Mitsubishi Chemical Polyester Film Co. and known under the trade name of Mitsubishi Diafoil) by sputtering using materials listed in TABLE 1. In Test Examples 7 to 10, the resistive layer was formed on the base material in film form by the use of materials listed in TABLE 1, and a coating layer was further formed on the resistive layer by the use of materials listed in TABLE 1. These test specimens were heated under an atmosphere having a temperature of 120° C. for predetermined time periods (24 hours, 100 hours and 1000 hours). A change in the sheet resistance of the resistive layer, after the heating with respect to the sheet resistance of the resistive layer before the heating was Calculated as a sheet resistance variation percentage (%), and was evaluated in accordance with the following indices.

○: The sheet resistance variation, percentage is less than 10%.

Δ: The sheet resistance variation percentage is not less than 10% and less than 15%.

×: The sheet resistance variation, percentage is not less than 15%.

[Reliability Evaluation 2]

Test specimens for evaluation of the resistive layer were produced in the same manner as the test specimens of Reliability Evaluation 1. These test specimens were placed under an atmosphere having a temperature of 85° C. and a humidity of 35% for predetermined time periods (24 hours, 100 hours and 1000 hours). A change in the sheet resistance of the resistive layer after the placement for the predetermined time periods with respect to the sheet resistance of the resistive layer before the placement for the predetermined time periods was calculated as a sheet resistance variation percentage (%), and was evaluated in accordance with the following indices.

○: The sheet resistance variation percentage is less than 10%.

Δ: The sheet resistance variation percentage is not less than 10% and less than 15%.

×: The sheet resistance variation percentage is not less than 15%.

The results in TABLE 1 show that Test Example 2 which uses ITO containing 20 wt. % of $SnO_2$ for the resistive layer and Test Example 3 which uses ITO containing 30 wt. % of $SnO_2$ for the resistive layer are highly evaluated in Reliability Evaluation 1 and Reliability Evaluation 2 to exhibit excellent durability. The results in TABLE 1 also show that Test Example 7 which uses ITO containing 20 wt. % of $SnO_2$ for the resistive layer and which has an undercoating layer provided on the resistive layer similarly exhibits excellent durability.

Next, Inventive Examples 1 to 14 and Comparative Examples 1 to 4 were produced pursuant to the first embodiment shown in FIG. 1 in a manner to be described below. Inventive Examples 15 to 34 were produced pursuant to the second embodiment shown in FIG. 7 in a manner to be described later. The electromagnetic wave absorbers in Inventive Examples 1 to 34 and Comparative Examples 1 to 4 were subjected to measurement and evaluation of return losses in the initial stage and after a lapse of 1000 hours under an atmosphere having a temperature of 120° C. The evaluation results of the return losses in the initial stage and after a lapse of 1000 hours under an atmosphere having a temperature of 120° C. were applied to indices to be described below, so that the evaluation of electromagnetic wave absorption performance was performed. The obtained results are also listed in TABLES 2 and 3.

[Return Losses]

Return losses (dB) for a millimeter wave of 76 GHz were measured pursuant to JIS R 1679 (Measurement methods for reflectivity of electromagnetic wave absorber in millimetre wave frequency), and were evaluated in accordance with indices to foe described below. The aforementioned measurements were made using n=5 for each of Inventive Examples and Comparative Examples, and the average was applied to the following indices and defined as an evaluation for each of Inventive Examples and Comparative Examples.

TABLE 1

| | Resistive layer | | Undercoating layer | Reliability evaluation 1 | | | Reliability evaluation 2 | | |
|---|---|---|---|---|---|---|---|---|---|
| | Material | Structure | Material | 24 hr. | 100 hr. | 1000 hr. | 24 h. | 100 hr. | 1000 hr. |
| Test Ex. 1 | Sn10% ITO | Amorphous | — | × | × | × | ○ | ○ | × |
| Test Ex. 2 | Sn20% ITO | Amorphous | — | ○ | ○ | ○ | ○ | ○ | Δ |
| Test Ex. 3 | Sn30% ITO | Amorphous | — | ○ | ○ | ○ | ○ | ○ | ○ |
| Test Ex. 4 | AZO | Polycrystalline | — | × | × | × | × | × | × |
| Test Ex. 5 | GZO | Polycrystalline | — | × | × | × | × | × | × |
| Test Ex. 6 | IZO | Amorphous | — | × | × | × | × | × | × |
| Test Ex. 7 | Sn20% ITO | Amorphous | $Al_2O_3$ | ○ | ○ | ○ | ○ | ○ | ○ |
| Test Ex. 8 | AZO | Polycrystalline | $Al_2O_3$ | × | × | × | × | × | × |
| Test Ex. 9 | GZO | Polycrystalline | $Al_2O_3$ | ○ | Δ | × | × | × | × |
| Test Ex. 10 | IZO | Amorphous | $Al_2O_3$ | × | × | × | ○ | × | × |

Sn10% ITO: $In_2O_3$ + 10 wt. % $SnO_2$
Sn20% ITO: $In_2O_3$ + 20 wt. % $SnO_2$
Sn30% ITO: $In_2O_3$ + 30 wt. % $SnO_2$
AZO: ZnO + 3 wt. % $Al_2O_3$
GZO: ZnO + 3 wt. % $Ga_2O_3$
IZO: $In_2O_3$ + 10 wt. % ZnO

∘∘: The return loss is not less than 30 dB.
∘: The return loss is not less than 20 dB and less than 30 dB.
Δ: The return loss is not less than 10 dB and less than 20 dB.
×: The return loss is less than 10 dB.

[Evaluation of Electromagnetic Wave Absorption Performance]

∘∘: Both of the return losses in the initial stage and after a lapse of 1000 hours under an atmosphere having a temperature of 120° C. are evaluated as "∘∘", and the electromagnetic wave absorption, performance is very excellent.

∘: One of the return losses in the initial, stage and after a lapse of 1000 hours under an atmosphere having a temperature of 120° C. is evaluated as "∘∘" and the other return loss is evaluated as "∘"; or both of the return losses are evaluated as "∘", and the electromagnetic wave absorption performance is excellent.

Δ: One of the return losses in the initial stage and after a lapse of 1000 hours under an atmosphere having a temperature of 120° C. is evaluated as "∘∘" or "∘" and the other return loss is evaluated as "Δ"; or both of the return losses are evaluated as "Δ" and the electromagnetic wave absorption performance is moderate.

×: At least one of the return losses in the initial stage and after a lapse of 1000 hours under an atmosphere having a temperature of 120° C. is evaluated as "×", and the electromagnetic wave absorption performance or the reliability thereof is poor.

Inventive Example 1

Pursuant to the method of the first embodiment-shown in FIG. 1, the resistive layer A was formed on the one resin layer b2 in film form made of PET (available from Mitsubishi Chemical Polyester Film Co. and known under the trade name of Mitsubishi Diafoil) by the use of ITO containing 30 wt. % of $SnO_2$ so as to provide a sheet resistance of 430 $\Omega/\square$. Also, ITO Containing 10 wt. % of $SnO_2$ was laminated onto the other resin layer b2 in film form (available from Mitsubishi Chemical Polyester Film Co. and known under the trade name of Mitsubishi Diafoil). An annealing process at a temperature of 150° C. for one hour was performed on the aforementioned ITO to form the ITO into a polycrystalline structure, thereby forming the electrically conductive layer C having a sheet, resistance of 20 $\Omega/\square$. A resin composition (EVA composition) pressed to a predetermined thickness was placed on the opposite surface of the other resin layer b2 with the electrically conductive layer C formed thereon from the electrically conductive layer C. The one resin layer b2 was overlaid on the resin composition so that the opposite surface of the one resin layer b2 from the resistive layer A faced the resin composition. Thereafter, the resin composition was cured to form the resin layer b1. Thus, an intended electromagnetic wave absorber was provided. At this time, the dielectric layer B had a relative dielectric constant, of 2.45.

Inventive Examples 2 and 3 and Comparative Examples 1 and 2

An intended electromagnetic wave absorber in each of Inventive Examples 2 and 3 and comparative Examples 1 and 2 was provided in substantially the same manner as in Inventive Example 1 except that the resistive layer A was formed using the blending amount of $SnO_2$ changed to that in percent by weight listed in TABLE 2.

Inventive Example 4

An intended electromagnetic wave absorber in Inventive Example 4 was provided in substantially the same manner as in Inventive Example 1 except that the electrically conductive layer C was formed using Al so as to provide a sheet resistance of 2 $\Omega/\square$ and that the resistive layer A was formed so as to have a sheet resistance of 380 $\Omega/\square$.

Inventive Examples 5 to 8

An intended electromagnetic wave absorber in each of Inventive Examples 5 to 8 was provided in substantially the same manner as in Inventive Example 1 except that the resistive layer A was formed so as to have a sheet resistance listed in TABLE 2.

Inventive Examples 9 to 11

An intended electromagnetic wave absorber in each of Inventive Examples 9 to 11 was provided in substantially the same manner as in Inventive Example 1 except that the dielectric layer B was formed by the use of the material listed in TABLE 2. At this time, the dielectric lever B had a relative dielectric constant of 2.45 in Inventive Example 9, a relative dielectric constant of 2.7 in Inventive Example 10 and a relative dielectric constant of 2.55 in Inventive Example of 11.

Inventive Examples 12 to 15

An intended electromagnetic wave absorber in each of Inventive Examples 12 to 15 was provided in substantially the same manner as in Inventive Example 1 except that the thickness of the resistive layer A was changed to that listed in TABLE 2.

Inventive Example 16

An intended electromagnetic wave absorber in Inventive Example 16 was provided in substantially the same manner as in Inventive Example 1 except that the resistive layer A having a thickness of 50 nm was formed by the use of 2.5 wt. % of $SiO_2$ and ITO containing 30 wt. % of $SnO_2$ and that the dielectric layer B was formed by the use of acrylic.

Comparative Example 3

An intended electromagnetic wave absorber in Comparative Example 3 was provided in substantially the same manner as in Inventive Example 1 except that the electrically conductive layer C was formed by the use of ITO containing 30 wt. % of $SnO_2$ so as to have a sheet resistance of 430 $\Omega/\square$ (equal to the sheet resistance of the resistive layer A).

Comparative Example 4

Ad intended electromagnetic wave absorber in Comparative Example 4 was provided, in substantially the same manner as in Inventive Example 1 except that the electrically conductive layer C was formed by the use of aluminum-doped zinc oxide (AZO) so as to have a sheet resistance of 600 $\Omega/\square$.

TABLE 2

| | Resistive layer A | | | | Electrically conductive layer C | | | Return loss | | Evaluation of electromagnetic wave absorption performance |
|---|---|---|---|---|---|---|---|---|---|---|
| | Material | Structure | Initial sheet resistance [Ω/□] | Thickness [nm] | Dielectric layer B Material of resin layer b1 | Material | Structure | Initial sheet resistance [Ω/□] | Initial stage | After lapse of 1000 hr. at 120° C. | |
| Inv. Ex. 1 | Sn30% ITO | Amorphous | 430 | 40 | EVA | Sn10% ITO | Polycrystalline | 20 | ⊚ | ⊚ | ⊚ |
| Inv. Ex. 2 | Sn20% ITO | Amorphous | 430 | 40 | EVA | Sn10% ITO | Polycrystalline | 20 | ⊚ | ○ | ○ |
| Inv. Ex. 3 | Sn40% ITO | Amorphous | 430 | 40 | EVA | Sn10% ITO | Polycrystalline | 20 | ⊚ | ○ | ○ |
| Inv. Ex. 4 | Sn30% ITO | Amorphous | 380 | 40 | EVA | Al | Polycrystalline | 2 | ⊚ | ⊚ | ⊚ |
| Inv. Ex. 5 | Sn30% ITO | Amorphous | 200 | 40 | EVA | Sn10% ITO | Polycrystalline | 20 | Δ | Δ | Δ |
| Inv. Ex. 6 | Sn30% ITO | Amorphous | 320 | 40 | EVA | Sn10% ITO | Polycrystalline | 20 | ○ | ○ | ○ |
| Inv. Ex. 7 | Sn30% ITO | Amorphous | 480 | 40 | EVA | Sn10% ITO | Polycrystalline | 20 | ○ | ○ | ○ |
| Inv. Ex. 8 | Sn30% ITO | Amorphous | 550 | 40 | EVA | Sn10% ITO | Polycrystalline | 20 | Δ | Δ | Δ |
| Inv. Ex. 9 | Sn30% ITO | Amorphous | 430 | 40 | Acrylic urethane | Sn10% ITO | Polycrystalline | 20 | ⊚ | ⊚ | ⊚ |
| Inv. Ex. 10 | Sn30% ITO | Amorphous | 430 | 40 | Acrylic | Sn10% ITO | Polycrystalline | 20 | ⊚ | ⊚ | ⊚ |
| Inv. Ex. 11 | Sn30% ITO | Amorphous | 430 | 40 | Urethane | Sn10% ITO | Polycrystalline | 20 | ⊚ | ⊚ | ⊚ |
| Inv. Ex. 12 | Sn30% ITO | Amorphous | 430 | 110 | EVA | Sn10% ITO | Polycrystalline | 20 | ⊚ | Δ | Δ |
| Inv. Ex. 13 | Sn30% ITO | Amorphous | 430 | 80 | EVA | Sn10% ITO | Polycrystalline | 20 | ⊚ | ○ | ○ |
| Inv. Ex. 14 | Sn30% ITO | Amorphous | 430 | 20 | EVA | Sn10% ITO | Polycrystalline | 20 | ⊚ | ○ | ○ |
| Inv. Ex. 15 | Sn30% ITO | Amorphous | 430 | 10 | EVA | Sn10% ITO | Polycrystalline | 20 | ⊚ | Δ | Δ |
| Inv. Ex. 16 | Sn30% ITO + 2.5% $SiO_2$ | Amorphous | 430 | 50 | Acrylic | Sn10% ITO | Polycrystalline | 20 | ⊚ | ⊚ | ⊚ |
| Comp. Ex. 1 | Sn15% ITO | Amorphous | 430 | 40 | EVA | Sn10% ITO | Polycrystalline | 20 | ⊚ | × | × |
| Comp. Ex. 2 | Sn50% ITO | Amorphous | 430 | 40 | EVA | Sn10% ITO | Polycrystalline | 20 | ⊚ | × | × |
| Comp. Ex. 3 | Sn30% ITO | Amorphous | 430 | 40 | EVA | Sn30% ITO | Amorphous | 430 | × | × | × |
| Comp. Ex. 4 | Sn30% ITO | Amorphous | 430 | 40 | EVA | AZO | Polycrystalline | 600 | × | × | × |

Sn10% ITO: $In_2O_3$ + 10 wt. % $SnO_2$
Sn15% ITO: $In_2O_3$ + 15 wt. % $SnO_2$
Sn20% ITO: $In_2O_3$ + 20 wt. % $SnO_2$
Sn30% ITO: $In_2O_3$ + 30 wt. % $SnO_2$
Sn40% ITO: $In_2O_3$ + 40 wt. % $SnO_2$
Sn50% ITO: $In_2O_3$ + 50 wt. % $SnO_2$
AZO: ZnO + 3 wt. % $Al_2O_3$

Inventive Example 17

Pursuant to the method of the second embodiment shown in FIG. 7, the resistive layer A was formed on the one resin layer B in film form made of PET (available from Mitsubishi Chemical Polyester Film Co. and known under the trade name of Mitsubishi Diafoil) by the use of ITO containing 30 wt. % of $SnO_2$ so as to provide a sheet resistance of 430 Ω/□. The coating layer E made of $SiO_2$ was formed on the resistive layer A so as to have a thickness of 20 nm. Also, ITO containing 10 wt. % of $SnO_2$ was laminated onto the other resin layer D in film form (available from Mitsubishi Chemical Polyester Film Co. and known under the trade name of Mitsubishi Diafoil). An annealing process at a temperature of 150° C. for one hour was performed on the aforementioned ITO to form the ITO into a polycrystalline structure, thereby forming the electrically conductive layer C having a sheet resistance of 20 Ω/□. The coating layer E' made of $SiO_2$ was formed on the electrically conductive layer C so as to have a thickness of 20 nm. A resin composition (EVA composition) pressed to a predetermined thickness was placed on the coating layer E'. The one resin layer D with the resistive layer A formed thereon was overlaid on the resin composition so that the coating layer E faced the resin composition. Thereafter, the resin composition was cured to form the dielectric layer B (resin layer b1). Thus, an intended electromagnetic wave absorber was provided. At this time, the dielectric layer B had a relative dielectric constant of 2.45.

Inventive Examples 18 to 36

The resistive layer A, the dielectric layer B, the electrically conductive layer C and the coating layers E and E' were formed pursuant to Inventive Example 17 so as to have configurations listed in TABLE 3. An intended electromagnetic wave absorber in each of Inventive Examples 18 to 36 was thus provided. The dielectric layer B had a relative dielectric constant of 2.55 when acrylic was used, a relative dielectric constant of 2.7 when urethane was used, a relative dielectric constant of 2.4 when SEPS was used, a relative dielectric constant of 2.3 when EPT was used, and a relative dielectric constant of 2.7 when silicone was used. In Inventive Example 26, the coating layer E' was not formed, but Al was directly laminated onto the other resin layer D.

TABLE 3

| | Resistive layer A | | | | Coating layer E | | Dielectric layer B |
|---|---|---|---|---|---|---|---|
| | Material | Structure | Initial sheet resistance [Ω/□] | Thickness [nm] | Material | Thickness [nm] | Material of resin layer b1 |
| Inv. Ex. 17 | Sn30% ITO | Amorphous | 430 | 40 | $SiO_2$ | 20 | EVA |
| Inv. Ex. 18 | Sn30% ITO | Amorphous | 430 | 40 | $SiO_2$ | 20 | Acrylic |
| Inv. Ex. 19 | Sn30% ITO | Amorphous | 430 | 40 | $SiO_2$ | 20 | Urethane |
| Inv. Ex. 20 | Sn30% ITO | Amorphous | 430 | 40 | $SiO_2$ | 20 | SEPS |
| Inv. Ex. 21 | Sn30% ITO | Amorphous | 430 | 40 | $SiO_2$ | 20 | EPT |
| Inv. Ex. 22 | Sn30% ITO | Amorphous | 430 | 40 | $SiO_2$ | 20 | Silicone |
| Inv. Ex. 23 | Sn30% ITO | Amorphous | 430 | 40 | AlN | 20 | EVA |
| Inv. Ex. 24 | Sn30% ITO | Amorphous | 430 | 40 | AlN | 20 | Acrylic |
| Inv. Ex. 25 | Sn30% ITO | Amorphous | 430 | 40 | AlN | 20 | Urethane |
| Inv. Ex. 26 | Sn30% ITO | Amorphous | 380 | 40 | AlN | 20 | Acrylic |
| Inv. Ex. 27 | Sn30% ITO | Amorphous | 430 | 40 | $Al_2O_3$ | 20 | EVA |
| Inv. Ex. 28 | Sn30% ITO | Amorphous | 430 | 40 | $Al_2O_3$ | 20 | Acrylic |
| Inv. Ex. 29 | Sn30% ITO | Amorphous | 430 | 40 | AZO | 20 | EVA |
| Inv. Ex. 30 | Sn30% ITO | Amorphous | 430 | 40 | AZO | 20 | Acrylic |
| Inv. Ex. 31 | Sn30% ITO | Amorphous | 430 | 40 | $Nb_2O_5$ | 20 | EVA |
| Inv. Ex. 32 | Sn30% ITO | Amorphous | 430 | 40 | $Nb_2O_5$ | 20 | Acrylic |
| Inv. Ex. 33 | Sn30% ITO | Amorphous | 430 | 40 | STO | 20 | EVA |
| Inv. Ex. 34 | Sn30% ITO | Amorphous | 430 | 40 | STO | 20 | Acrylic |
| Inv. Ex. 35 | Sn30% ITO | Amorphous | 430 | 40 | SiN | 20 | EVA |
| Inv. Ex. 36 | Sn30% ITO | Amorphous | 430 | 40 | SiN | 20 | Acrylic |

| | Electrically conductive layer C | | | Coating layer E' | | Return loss | | Electromagnetic wave absorption performance Evaluation |
|---|---|---|---|---|---|---|---|---|
| | Material | Structure | Initial sheet resistance [Ω/□] | Material | Thickness [nm] | Initial stage | After lapse of 1000 hr. at 120° C. | |
| Inv. Ex. 17 | Sn10% ITO | Polycrystalline | 20 | $SiO_2$ | 20 | ○○ | ○○ | ○○ |
| Inv. Ex. 18 | Sn10% ITO | Polycrystalline | 20 | $SiO_2$ | 20 | ○○ | ○○ | ○○ |
| Inv. Ex. 19 | Sn10% ITO | Polycrystalline | 20 | $SiO_2$ | 20 | ○○ | ○○ | ○○ |
| Inv. Ex. 20 | Sn10% ITO | Polycrystalline | 20 | $SiO_2$ | 20 | ○○ | ○○ | ○○ |

TABLE 3-continued

| | | | | | | | | |
|---|---|---|---|---|---|---|---|---|
| Inv. Ex. 21 | Sn10% ITO | Polycrystalline | 20 | SiO$_2$ | 20 | oo | oo | oo |
| Inv. Ex. 22 | Sn10% ITO | Polycrystalline | 20 | SiO$_2$ | 20 | oo | oo | oo |
| Inv. Ex. 23 | Sn10% ITO | Polycrystalline | 20 | AlN | 20 | oo | oo | oo |
| Inv. Ex. 24 | Sn10% ITO | Polycrystalline | 20 | AlN | 20 | oo | oo | oo |
| Inv. Ex. 25 | Sn10% ITO | Polycrystalline | 20 | AlN | 20 | oo | oo | oo |
| Inv. Ex. 26 | Al | Polycrystalline | 2 | — | — | oo | oo | oo |
| Inv. Ex. 27 | Sn10% ITO | Polycrystalline | 20 | Al$_2$O$_3$ | 20 | oo | oo | oo |
| Inv. Ex. 28 | Sn10% ITO | Polycrystalline | 20 | Al$_2$O$_3$ | 20 | oo | oo | oo |
| Inv. Ex. 29 | Sn10% ITO | Polycrystalline | 20 | AZO | 20 | oo | oo | oo |
| Inv. Ex. 30 | Sn10% ITO | Polycrystalline | 20 | AZO | 20 | oo | oo | oo |
| Inv. Ex. 31 | Sn10% ITO | Polycrystalline | 20 | Nb$_2$O$_5$ | 20 | oo | oo | oo |
| Inv. Ex. 32 | Sn10% ITO | Polycrystalline | 20 | Nb$_2$O$_5$ | 20 | oo | oo | oo |
| Inv. Ex. 33 | Sn10% ITO | Polycrystalline | 20 | STO | 20 | oo | oo | oo |
| Inv. Ex. 34 | Sn10% ITO | Polycrystalline | 20 | STO | 20 | oo | oo | oo |
| Inv. Ex. 35 | Sn10% ITO | Polycrystalline | 20 | SiN | 20 | oo | oo | oo |
| Inv. Ex. 36 | Sn10% ITO | Polycrystalline | 20 | SiN | 20 | oo | oo | oo |

Sn10% ITO: In$_2$O$_3$ + 10 wt. % SnO$_2$
Sn30% ITO: In$_2$O$_3$ + 30 wt. % SnO$_2$

The results in TABLES 2 and 3 showed that each of Inventive Examples 1 to 36 had excellent electromagnetic wave absorption performance to maintain the performance thereof over a long period of time even in the ease of a change in surrounding environment. This is because the resistive layer A in each of Inventive Examples 1 to 36 holds a set sheet resistance over a long period of time under heated environments as shown in the aforementioned results in TABLE 1. In particular, it is found that each of Inventive Examples 17 to 36 including at least one of the coating layer E and the coating layer E' has very excellent electromagnetic wave absorption performance. On the other hand, Comparative Examples 1 and 2, in which the resistance value of the resistive layer A changed with time in the case of a change in surrounding environment due to a smaller or larger amount of SnO$_2$ added to ITO in the material of the resistive layer A, could not maintain the initial excellent electromagnetic wave absorption performance over a long period of time. Comparative Examples 3 and 4, in which the sheet resistance of the electrically conductive layer C was equal to or higher than that of the resistive layer A, could not obtain sufficient electromagnetic wave absorption performance.

The electromagnetic wave absorber in each Inventive Example described above, may not only be attached to any location of a member in which it is desired to absorb unwanted, electromagnetic waves but also be previously installed on a member, e.g. a vehicle body member, which might receive unwanted electromagnetic waves. In this case, the electromagnetic wave absorber is always disposed in position to exhibit, more stable electromagnetic wave absorption performance. Examples of such a member include resin molded articles or metal molded articles such as bumpers, grilles, fenders, spoilers, emblems, brackets and bumper beams. Thus, a molded article including the electromagnetic wave absorber according to the present disclosure is capable of exhibiting excellent electromagnetic wave absorption performance with higher stability.

Although specific forms in the present disclosure have been described in the aforementioned examples, the aforementioned examples should be considered as merely illustrative and not restrictive. It is contemplated that various modifications evident to those skilled in the art could be made without departing from the scope of the present disclosure.

The present, disclosure, which is capable of holding the performance capability of absorbing unwanted electromagnetic waves over a long period of time, is preferably used for an electromagnetic wave absorber for a millimeter-wave radar for use in a vehicle collision avoidance system. The present disclosure may be used for other purposes of suppressing radio wave interference and reducing noises in an intelligent transport system (ITS) that performs information communications between vehicles, roads and persons and in a next generation mobile communication system (5G) using millimeter waves.

REFERENCE SIGNS LIST

A Resistive layer
B Dielectric layer
C Electrically conductive layer

The invention claimed is:
1. An electromagnetic wave absorber comprising:
a dielectric layer including a polymer film and having a first surface and a second surface;
a resistive layer formed on the first surface of the dielectric layer and containing indium tin oxide as a main component; and an electrically conductive layer formed on the second surface of the dielectric layer and having a sheet resistance lower than that of the resistive layer, wherein the indium tin oxide in the resistive layer contains 20 to 40 wt. % of tin oxide based on the total weight of the indium tin oxide.

2. The electromagnetic wave absorber according to claim 1, wherein the resistive layer contains a component other than the indium tin oxide.

3. The electromagnetic wave absorber according to claim 2, wherein the component other than the indium tin oxide in the resistive layer is at least one selected from the oup consisting of silicon oxide, magnesium oxide and zinc oxide.

4. The electromagnetic wave absorber according to claim 1, wherein the electrically conductive layer is made of indium tin oxide.

5. The electromagnetic wave absorber according to claim 4, wherein the indium tin oxide in the electrically conductive layer contains 5 to 15 wt % of tin oxide based on the total weight of the indium tin oxide.

6. The electromagnetic wave absorber according to claim 1, wherein the electrically conductive layer is made of at least, one selected from the group consisting of aluminum, copper and their alloys.

7. The electromagnetic wave absorber according claim 1, wherein the resistive layer has a sheet resistance in a range of 300 to 500 Ω/□.

8. The electromagnetic wave absorber according to claim 1, wherein the resistive layer has a thickness in a range of 20 to 100 nm.

9. The electromagnetic wave absorber according to claim 1, wherein the dielectric layer includes a polymer film having a relative dielectric constant of 2.0 to 20.0.

10. The electromagnetic wave absorber according to claim 1, wherein the polymer film of the dielectric layer is made of at least one selected from the group consisting of ethylene-vinyl acetate copolymer, vinyl chloride, urethane, acrylic, acrylic urethane, polyethylene, silicone and polyethylene terephthalate.

11. The electromagnetic wave absorber according to claim 1, wherein a coating layer is provided in at least one of a location between the dielectric layer and the resistive layer and a location between the dielectric layer and the electrically conductive layer.

12. The electromagnetic wave absorber according to claim 11, wherein the coating layer is made of at least one selected from the group consisting of silicon oxide, silicon nitride, aluminum oxide, aluminum nitride, niobium oxide, silicon tin oxide and aluminum-doped zinc oxide.

13. The electromagnetic wave absorber according to claim 11, wherein the coating layer has a thickness in a range of 5 to 100 nm.

14. The electromagnetic wave absorber according to claim 1, further comprising an adhesive layer provided outside the electrically conductive layer.

15. A molded article equipped with the electromagnetic wave absorber as recited in claim 1.

* * * * *